(12) United States Patent
Kim et al.

(10) Patent No.: US 9,716,252 B2
(45) Date of Patent: Jul. 25, 2017

(54) ORGANIC LIGHT EMITTING DISPLAY PANEL AND METHOD OF MANUFACTURING THE SAME

(71) Applicant: Samsung Display Co., Ltd., Yongin-si, Gyeonggi-do (KR)

(72) Inventors: Jae Hoon Kim, Yongin-si (KR); Sung Woong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/981,784

(22) Filed: Dec. 28, 2015

(65) Prior Publication Data

US 2016/0118631 A1    Apr. 28, 2016

Related U.S. Application Data

(62) Division of application No. 13/733,859, filed on Jan. 3, 2013, now Pat. No. 9,224,975.

(30) Foreign Application Priority Data

Sep. 21, 2012    (KR) .................... 10-2012-0105410

(51) Int. Cl.
*H01L 51/56*    (2006.01)
*H01L 51/52*    (2006.01)
(Continued)

(52) U.S. Cl.
CPC .......... *H01L 51/56* (2013.01); *H01L 27/3246* (2013.01); *H01L 33/08* (2013.01);
(Continued)

(58) Field of Classification Search
CPC .................... H01L 51/0018; G03F 1/0084
See application file for complete search history.

(56) References Cited

U.S. PATENT DOCUMENTS 7,122,954 B2    10/2006    Nozawa
7,619,258 B2    11/2009    Tsuchiya et al.
(Continued)

FOREIGN PATENT DOCUMENTS

CN    1573368 A    2/2005
JP    2003-257650 A    9/2003
(Continued)

OTHER PUBLICATIONS

Terasawa et al., "Imaging characteristics of multi-phase-shifting and halftone phase-shifting masks," Japanese Journal of Applied Physics, vol. 30, No. 11B, Nov. 1991, pp. 2991-2997.*
(Continued)

*Primary Examiner* — Karen Kusumakar
(74) *Attorney, Agent, or Firm* — Lewis Roca Rothgerber Christie LLP

(57) ABSTRACT

An organic light emitting display panel including a partition wall to prevent different organic light emitting materials from being mixed with each other between adjacent light emitting areas. The partition wall may protrude from a surface of a pixel definition layer or a first common layer. Accordingly, desired light colors are generated by organic light emitting patterns respectively disposed in the light emitting areas.

9 Claims, 18 Drawing Sheets

(51) Int. Cl.
  *H01L 33/08* (2010.01)
  *H01L 51/00* (2006.01)
  *H01L 51/50* (2006.01)
  *H01L 27/32* (2006.01)

(52) U.S. Cl.
  CPC ...... *H01L 51/0004* (2013.01); *H01L 51/0005* (2013.01); *H01L 51/5012* (2013.01); *H01L 51/5203* (2013.01); *H01L 2227/323* (2013.01)

(56) References Cited

U.S. PATENT DOCUMENTS

| | | | |
|---|---|---|---|
| 8,258,523 | B2 | 9/2012 | Lee et al. |
| 8,384,095 | B2 | 2/2013 | Lee et al. |
| 8,598,572 | B2 | 12/2013 | Mathea et al. |
| 2003/0111957 | A1 | 6/2003 | Kim et al. |
| 2003/0189400 | A1 | 10/2003 | Nishio et al. |
| 2004/0056588 | A1* | 3/2004 | Nozawa .............. H01L 27/3244 313/504 |
| 2005/0008770 | A1 | 1/2005 | Kawase |
| 2005/0189535 | A1 | 9/2005 | Hsueh et al. |
| 2007/0205420 | A1 | 9/2007 | Ponjee et al. |
| 2008/0143251 | A1 | 6/2008 | Mathea et al. |
| 2008/0315756 | A1* | 12/2008 | Jeon .................... H01L 27/3246 313/504 |
| 2009/0295280 | A1 | 12/2009 | Yang |
| 2010/0155760 | A1 | 6/2010 | Lee et al. |
| 2010/0207107 | A1 | 8/2010 | Kim |
| 2011/0198596 | A1* | 8/2011 | Park .................... H01L 27/3246 257/59 |
| 2011/0221334 | A1 | 9/2011 | Kwon et al. |
| 2011/0260183 | A1 | 10/2011 | Mathea et al. |
| 2012/0007067 | A1 | 1/2012 | Kaneta et al. |
| 2012/0025229 | A1 | 2/2012 | Lee et al. |
| 2012/0135556 | A1* | 5/2012 | Takeuchi ............ H01L 27/3246 438/34 |
| 2012/0319089 | A1 | 12/2012 | Shin et al. |
| 2013/0119366 | A1 | 5/2013 | Nishiyama et al. |
| 2013/0126846 | A1 | 5/2013 | Harada et al. |
| 2014/0070179 | A1 | 3/2014 | Kim |

FOREIGN PATENT DOCUMENTS

| | | |
|---|---|---|
| JP | 2004-361491 A | 12/2004 |
| JP | 2010-192215 A | 9/2010 |
| JP | 2011-171268 A | 9/2011 |
| JP | 2012-109138 A | 6/2012 |
| KR | 10-0553490 | 2/2006 |
| KR | 10-0707601 | 4/2007 |
| KR | 10-2011-0105534 | 9/2011 |
| TW | 201225729 A1 | 6/2012 |
| WO | WO 2010/109877 A1 | 9/2010 |

OTHER PUBLICATIONS

Korean Patent Abstracts issued in Publication 1020040019941 A, dated Mar. 6, 2004, for corresponding Korean Patent KR 10-0553490.

* cited by examiner

ORGANIC LIGHT EMITTING DISPLAY PANEL AND METHOD OF MANUFACTURING THE SAME

CROSS-REFERENCE TO RELATED APPLICATION

This application is a divisional of U.S. patent application Ser. No. 13/733,859, filed Jan. 3, 2013, issued as U.S. Pat. No. 9,224,975, which claims priority to and the benefit of Korean Patent Application No. 10-2012-0105410, filed Sep. 21, 2012, the entire content of both of which is incorporated herein by reference.

BACKGROUND

1. Field

The present disclosure relates to an organic light emitting display panel and a method of manufacturing the same. More particularly, the present disclosure relates to an organic light emitting display panel including organic light emitting patterns formed of different materials and a method of manufacturing the organic light emitting display panel.

2. Description of the Related Art

An organic light emitting display includes an organic light emitting display panel and a driver that controls the organic light emitting display panel. The organic light emitting display panel includes a plurality of pixels each including an organic light emitting device. The organic light emitting device includes organic light emitting patterns and electrodes for applying driving voltages to the organic light emitting patterns. In addition, common electrodes are located between the organic light emitting patterns and the electrodes.

At least one portion of the pixels includes organic light emitting patterns formed of a material different from a material used to form organic light emitting patterns of another portion of the pixels. For example, one portion of the organic light emitting patterns may include a material to emit a red light, another portion of the organic light emitting patterns may include a material to emit a green light, still another portion of the organic light emitting patterns may include a material to emit a blue light, and yet another portion of the organic light emitting patterns may include a material to emit a white light.

SUMMARY

Aspects of the present disclosure provide an organic light emitting display panel for reducing defects of a pixel, and a method of manufacturing the organic light emitting display panel.

One or more embodiments of the present invention provide an organic light emitting display panel that includes: a base substrate; a first electrode layer including a plurality of first electrodes on the base substrate; a pixel definition layer on the base substrate, having a plurality of openings to respectively expose the first electrodes, and including a partition wall protruding from a surface thereof; a first common layer covering the first electrodes and the pixel definition layer; an organic light emitting layer on the first common layer and including a plurality of organic light emitting patterns corresponding to the first electrodes, respectively; and a second electrode layer on the organic light emitting layer.

The first common layer may include at least one of a hole injection layer or a hole transfer layer.

The organic light emitting display panel may further include a second common layer between the organic light emitting layer and the second electrode layer.

The second common layer may include at least one of an electron injection layer or an electron transfer layer.

The first electrodes may be in a matrix form with rows and columns, and the partition wall may include a first portion extending in a row direction and a second portion extending in a column direction. The first portion may be integrally formed with the second portion.

The first portion may be one of a plurality of first portions, each first portion may be between two first electrodes adjacent to each other in the column direction, and the second portion may be one of a plurality of second portions, each second portion may be between two first electrodes adjacent to each other in the row direction.

Additionally, one or more embodiments of the present invention may provide for a method of manufacturing an organic light emitting display panel that includes: forming a first electrode layer including a plurality of first electrodes on a base substrate; forming a pixel definition layer having a plurality of openings to respectively expose the first electrodes and including a partition wall protruding from a surface thereof; forming a first common layer covering the first electrodes and the pixel definition layer; providing an organic light emitting material in a liquid state to areas corresponding to the openings to form an organic light emitting layer including a plurality of organic light emitting patterns; and forming a second electrode layer on the organic light emitting layer.

The method may further include forming a second common layer between the organic light emitting layer and the second electrode layer to cover the organic light emitting layer.

The forming of the pixel definition layer may include: forming a base layer on the base substrate to cover the first electrodes; and patterning the base layer using a mask including a transmission area corresponding to the openings, a block area corresponding to the partition wall, and a semi-transmission area adjacent to the transmission area and the block area.

The organic light emitting material in the liquid state provided to portions of the areas corresponding to the openings may be different from an organic light emitting material in the liquid state provided to other portions of the areas corresponding to the openings.

Additionally, an organic light emitting display panel according to another embodiment of the present invention may include: a base substrate; a first electrode layer having a plurality of first electrodes on the base substrate; a pixel definition layer having a plurality of openings to respectively expose the first electrodes; a first common layer including a partition wall protruding from a surface thereof, the first common layer covering the first electrodes and the pixel definition layer, and the partition wall being overlapped with the pixel definition layer; an organic light emitting layer on the first common layer and including a plurality of organic light emitting patterns corresponding to the first electrodes, respectively; and a second electrode layer on the organic light emitting layer.

The first common layer may include at least one of a hole injection layer or a hole transfer layer.

The first common layer may include the hole injection layer and the hole transfer layer on the hole injection layer, and the partition wall protrudes from the hole injection layer.

The organic light emitting display panel may further include a second common layer between the organic light emitting layer and the second electrode layer.

The second common layer may include at least one of an electron injection layer or an electron transfer layer.

The first electrodes may be in a matrix form with rows and columns, and the partition wall may include a first portion extending in a row direction and a second portion extending in a column direction.

The first portion of the partition may be integrally formed with the second portion of the partition wall.

The first portion may be one of a plurality of first portions, each first portion may be between two first electrodes adjacent to each other in the column direction, and the second portion may be one of a plurality of second portions, each second portion may be between two first electrodes adjacent to each other in the row direction.

Further, a method of manufacturing an organic light emitting display panel according to another embodiment includes: forming a first electrode layer including a plurality of first electrodes on a base substrate; forming a pixel definition layer having a plurality of openings to respectively expose the first electrodes; forming a first common layer including a partition wall protruding from a surface of an area of the first common layer overlapped with the pixel definition layer, the first common layer covering the first electrodes and the pixel definition layer; providing an organic light emitting material in a liquid state to areas corresponding to the openings to form an organic light emitting layer including a plurality of organic light emitting patterns; and forming a second electrode layer on the organic light emitting layer.

The method may further include forming a second common layer between the organic light emitting layer and the second electrode layer to cover the organic light emitting layer.

The forming of the first common layer may include: forming a base layer on the base substrate to cover the first electrodes; and patterning the base layer using a mask including a block area corresponding to the partition wall and a transmission area adjacent to the block area.

The base layer may include a first layer formed from a hole injection material and a second layer on the first layer and formed from a hole transfer material, and the partition wall may be formed by removing portions of the second layer in a thickness direction of the second layer.

The organic light emitting material in the liquid state provided to portions of the areas corresponding to the openings may be different from the organic light emitting material in the liquid state provided to other portions of the areas corresponding to the openings.

According to the above, one or more embodiments of the organic light emitting display panel includes the partition wall to prevent (or inhibit) different organic light emitting materials from being mixed with each other between adjacent light emitting areas. Thus, desired light colors may be generated by organic light emitting patterns respectively disposed in the light emitting areas.

According to one or more embodiments of the method of manufacturing the organic light emitting display panel, the organic light emitting material in the liquid state is provided to the areas respectively corresponding to the openings. The partition wall prevents (or inhibits) the organic light emitting material provided to one opening from being mixed with the organic light emitting material provided to another opening adjacent to the one opening.

BRIEF DESCRIPTION OF THE DRAWINGS

The above and other aspects of the present invention will become readily apparent by reference to the following detailed description when considered in conjunction with the accompanying drawings, wherein.

DETAILED DESCRIPTION

Figure 1:
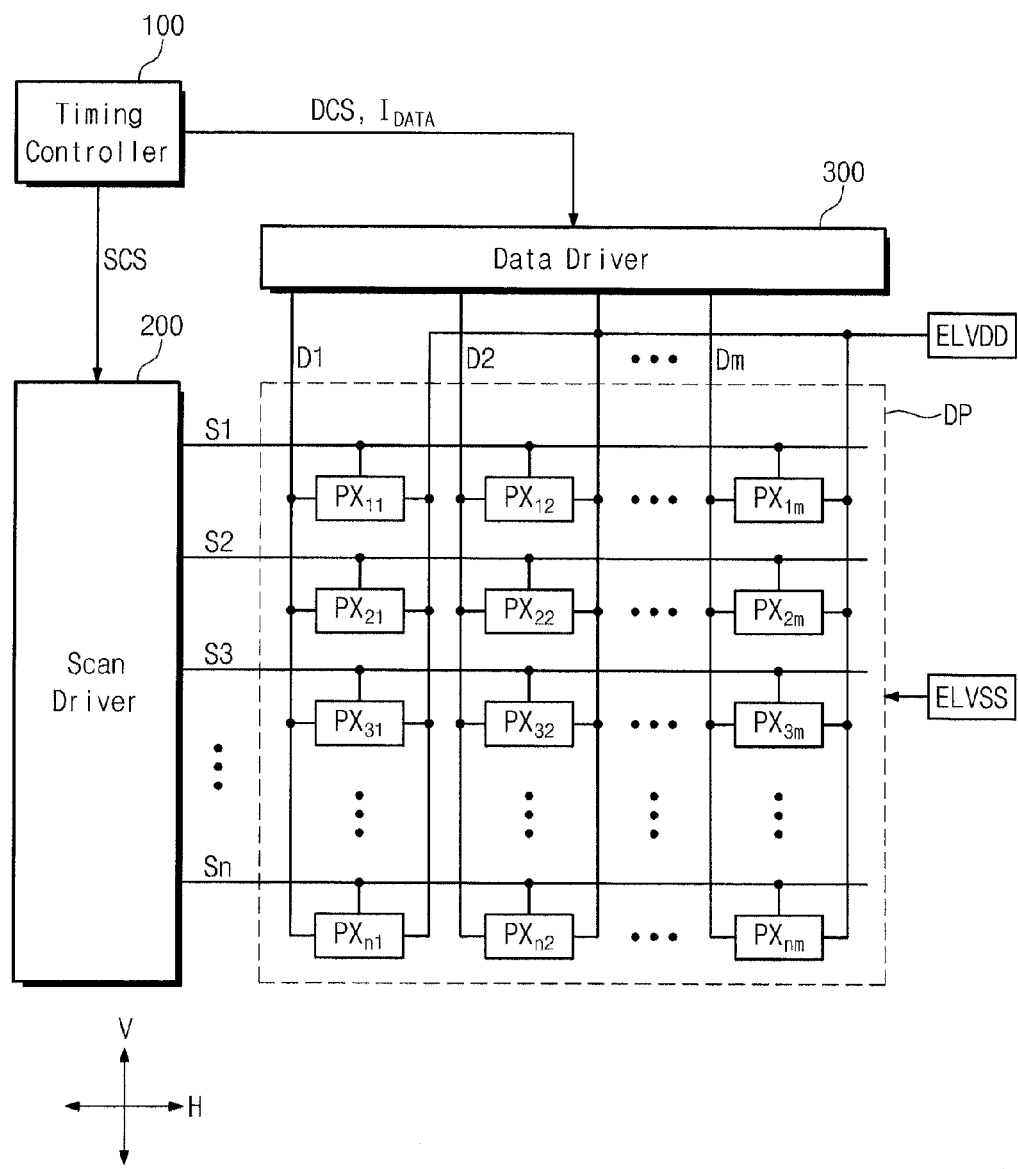
FIG. 1 is a block diagram showing an organic light emitting display according to an exemplary embodiment of the present invention.

When an element or layer is referred to as being "on", "connected to" or "coupled to" another element or layer, it can be directly on, connected or coupled to the other element or layer, or one or more intervening elements or layers may be interposed therebetween. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and should not limit the invention. As used herein, the singular forms, "a", "an" and "the" are intended to include the plural forms as well, unless the context clearly indicates otherwise. The terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. Further, terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
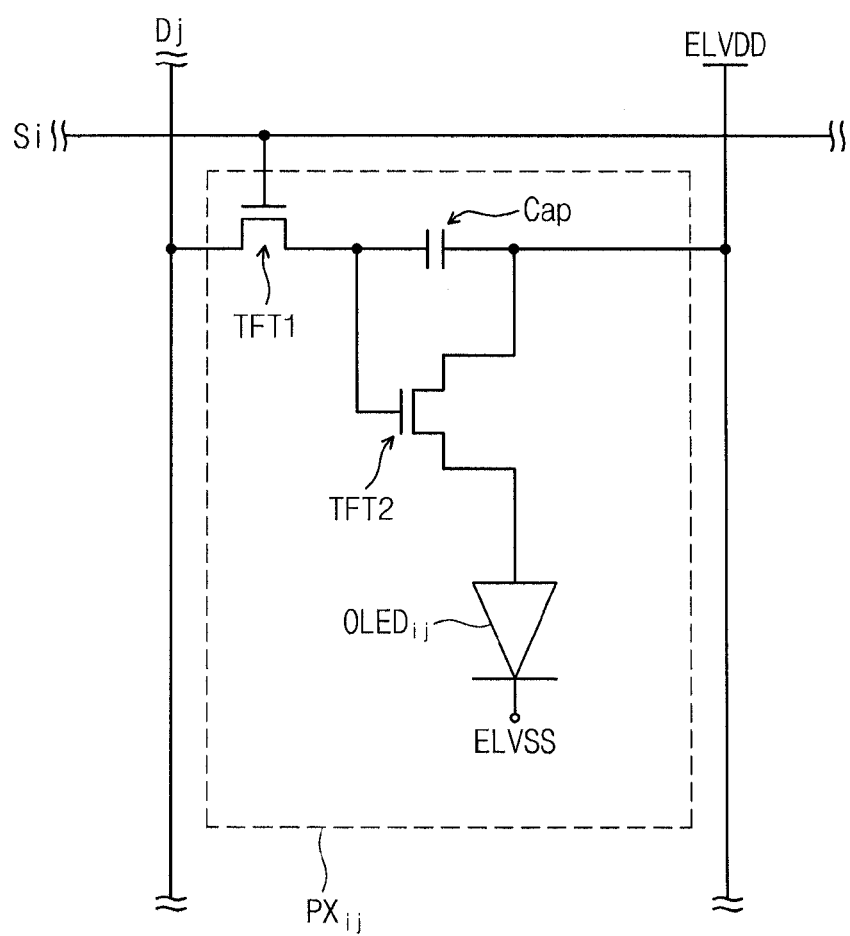
FIG. 2 is an equivalent circuit diagram illustrating a pixel of FIG. 1.

FIG. 1 is a block diagram illustrating an organic light emitting display according to an exemplary embodiment of the present invention, and FIG. 2 is an equivalent circuit diagram illustrating a pixel of FIG. 1.

Referring to FIG. 1, an organic light emitting display includes an organic light emitting display panel DP (hereinafter, referred to as display panel), a timing controller 100, a scan driver 200, and a data driver 300.

The display panel DP includes a base substrate BS (refer to FIG. 4), a plurality of scan lines S1 to Sn arranged on the base substrate BS, a plurality of data lines D1 to Dm arranged on the base substrate BS, and a plurality of pixels $PX_{11}$ to PXnm each connected to a corresponding scan line of the scan lines S1 to Sn and to a corresponding data line of the data lines D1 to Dm.

The scan lines S1 to Sn may extend in a first direction H (e.g., a horizontal direction) on the base substrate BS, and may be spaced apart from each other in a second direction V (e.g., a vertical direction), which crosses (e.g., is perpendicular to) the first direction H. The data lines D1 to Dm are insulated from the scan lines S1 to Sn, and cross the scan lines S1 to Sn. The data lines D1 to Dm may extend in the second direction V, and may be spaced apart from each other in the first direction H.

The display panel DP may receive a first source voltage ELVDD and a second source voltage ELVSS from an external source (not shown). Each of the pixels $PX_{11}$ to PXnm is turned on in response to a corresponding scan signal received from a corresponding scan line S1 to Sn. Each of the pixels $PX_{11}$ to PXnm may receive the first source voltage ELVDD and the second source voltage ELVSS and generates a light in response to a corresponding data signal received from a corresponding data line D1 to Dm. The first source voltage ELVDD may have a voltage level higher than that of the second source voltage ELVSS.

Each of the pixels $PX_{11}$ to PXnm includes at least one transistor, at least one capacitor, and an organic light emitting device. FIG. 2 shows the equivalent circuit diagram of a pixel PXij connected to an i-th scan line Si of the scan lines S1 to Sn and a j-th data line Dj of the data lines D1 to Dm.

In FIG. 2, the pixel PXij includes a first transistor TFT1, a second transistor TFT2, a capacitor Cap, and an organic light emitting device (e.g., an organic light emitting diode) OLEDij. The first transistor TFT1 includes a control electrode connected to the i-th scan line Si, an input electrode connected to the j-th data line Dj, and an output electrode. The first transistor TFT1 outputs a data signal applied through the j-th data line Dj in response to the scan signal applied to the i-th scan line Si.

The capacitor Cap includes a first electrode connected to the first transistor TFT1 and a second electrode applied with the first source voltage ELVDD. The capacitor Cap may be charged with the electric charge corresponding to a difference between a voltage corresponding to the data signal provided from the first transistor TFT1 and the first source voltage ELVDD.

The second transistor TFT2 includes a control electrode connected to the output electrode of the first transistor TFT1 and the first electrode of the capacitor Cap, an input electrode applied with the first source voltage ELVDD, and an output electrode. The output electrode of the second transistor TFT2 is connected to the organic light emitting device OLEDij.

The second transistor TFT2 controls a driving current flowing through the organic light emitting device OLEDij in accordance with the electric charge amount charged in the capacitor Cap. A turn-on time of the second transistor TFT2 is determined by the electric charge amount charged in the capacitor Cap. The output electrode of the second transistor TFT2 applies a voltage having a level lower than that of the first source voltage ELVDD to the organic light emitting device OLEDij.

The organic light emitting device OLEDij includes a first electrode connected to the second transistor TFT2 and a second electrode connected to receive the second source voltage ELVSS. The organic light emitting device OLEDij may include a first common layer, an organic light emitting pattern, and a second common layer, which are all between the first and second electrodes. The organic light emitting device OLEDij may emit light during the turn-on time of the second transistor TFT2. The light generated by the organic light emitting device OLEDij has a color determined by a material used to form the organic light emitting pattern. For example, the light emitted from the organic light emitting device OLEDij may have one of red, green, blue, or white colors.

The timing controller 100 may receive image signals and may convert the image signals to image data $I_{DATA}$ appropriate to an operation mode of the display panel DP. The timing controller 100 may output the image data $I_{DATA}$ and various control signals SCS and DCS.

The scan driver 200 may receive a scan driving control signal SCS from the timing controller 100 and may generate a plurality of scan signals in response to the scan driving control signal SCS. The scan signals may be sequentially applied to the scan lines S1 to Sn.

The data driver 300 may receive a data driving control signal DCS and the image data $I_{DATA}$ from the timing controller 100. The data driver 300 may generate a plurality of data signals according to the data driving control signal DCS and the image data $I_{DATA}$. The data signals are applied to the data lines D1 to Dm.

Figure 3:
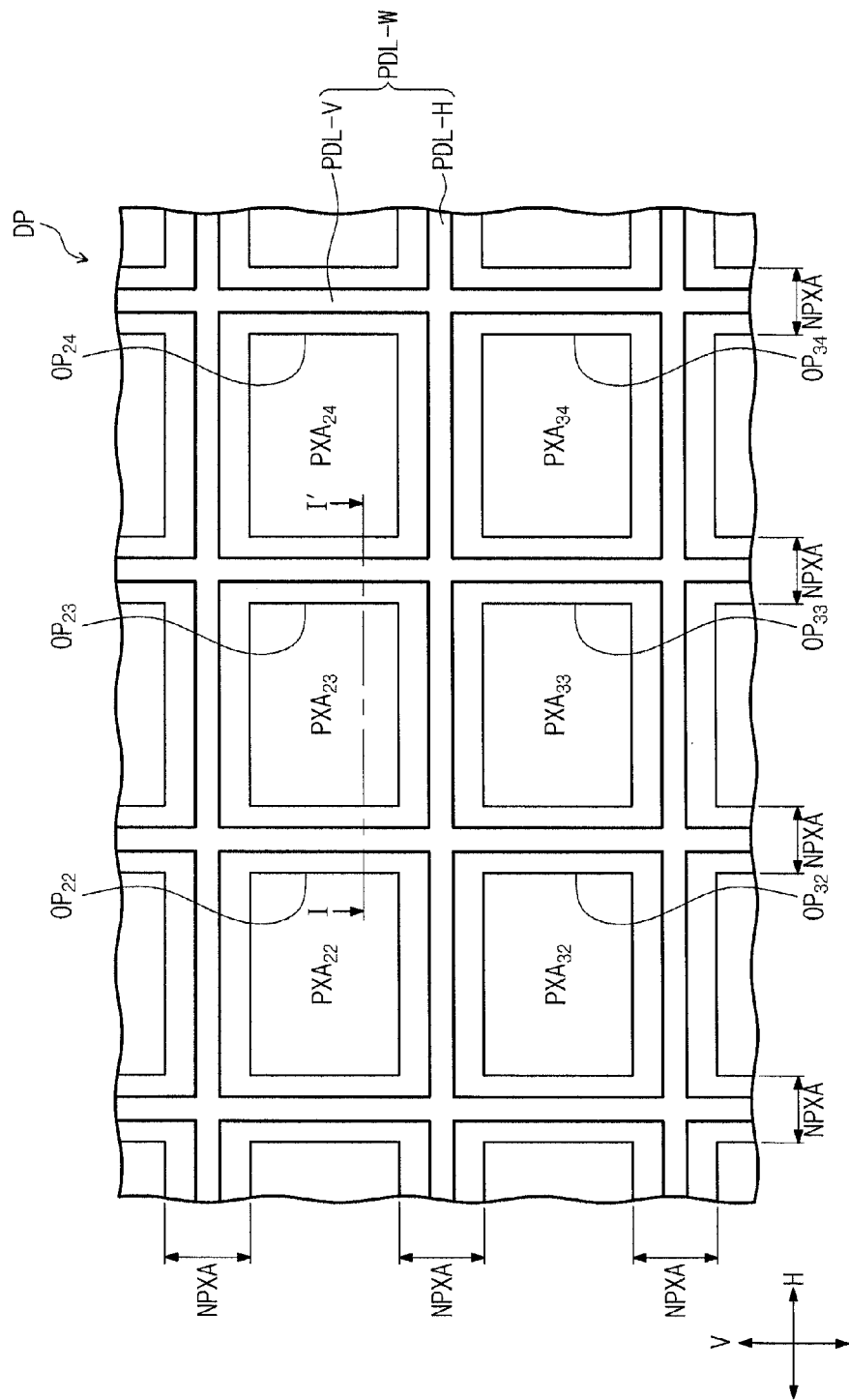
FIG. 3 is a schematic plan view illustrating a display panel according to an exemplary embodiment of the present invention.
Figure 4:
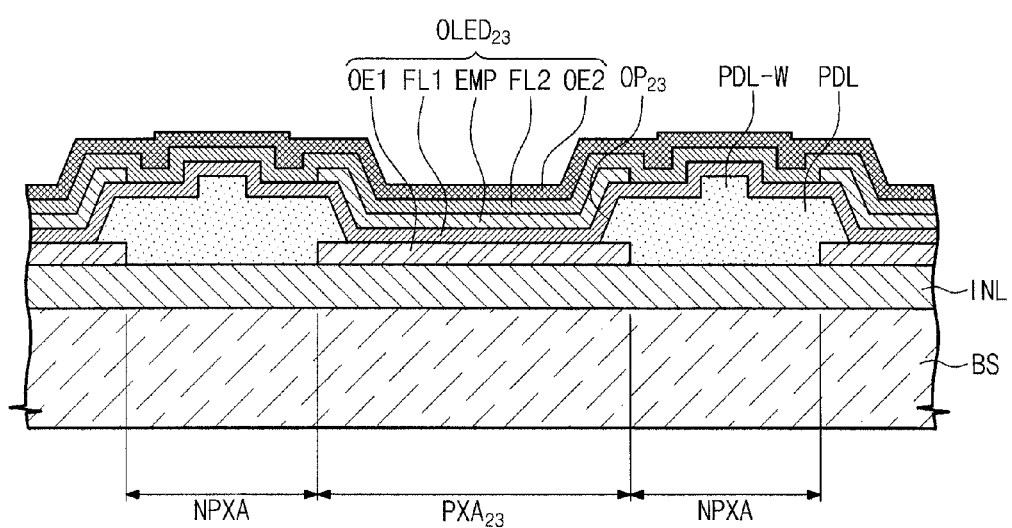
FIG. 4 is a schematic cross-sectional view taken along the line I-I' of FIG. 3.

FIG. 3 is a schematic plan view illustrating a display panel according to an exemplary embodiment of the present invention, and FIG. 4 is a schematic cross-sectional view taken along a line I-I' of FIG. 3. In particular, FIG. 3 illustrates six light emitting areas $PXA_{22}$ to $PXA_{34}$ respectively corresponding to six openings $OP_{22}$ to $OP_{34}$, and FIG. 4 illustrates a schematic cross section of one of the six light emitting areas $PXA_{22}$ to $PXA_{34}$.

Referring to FIG. 3, the display panel DP includes light emitting areas $PXA_{22}$ to $PXA_{34}$ and a non-light emitting area NPXA adjacent to the light emitting areas $PXA_{22}$ to $PXA_{34}$. The light emitting areas $PXA_{22}$ to $PXA_{34}$ may be surrounded (e.g., the perimeter may be surrounded) by the non-light emitting area NPXA. The first electrodes of the organic light emitting device OLED11 to OLEDnm of the pixels PX11 to PXnm are disposed in the light emitting areas $PXA_{22}$ to $PXA_{34}$, respectively.

Referring to FIG. 4, an insulating layer INL is disposed on the surface of the base substrate BS. Although not shown in detail, the insulating layer INL may include a plurality of thin layers. The thin layers may include an inorganic thin layer and/or an organic thin layer. Thin film transistors may be formed between the surface of the base substrate BS and the insulating layer INL. The thin film transistors may be the first and second transistors TFT1 and TFT2 (refer to FIG. 2).

In FIG. 4, a pixel definition layer PDL including the opening $OP_{23}$ formed therethrough is disposed on the insulating layer INL. The opening $OP_{23}$ corresponds to the light emitting area $PXA_{23}$. The organic light emitting device $OLED_{23}$ may be disposed on the insulating layer INL. The organic light emitting device $OLED_{23}$ may include a first electrode OE1, a first common layer FL1, an organic light emitting pattern EMP, a second common layer FL2, and a second electrode OE2. In the present exemplary embodiment, the first electrode OE1 and the second electrode OE2 may be referred to as a positive electrode and a negative electrode, respectively.

The first electrode OE1 is arranged corresponding to the light emitting area $PXA_{23}$. The first electrode OE1 may receive the first source voltage ELVDD. The opening $OP_{23}$ may expose at least a portion of the first electrode OE1. Although not shown in the figures, the first electrodes OE1 respectively disposed in the light emitting areas $PXA_{22}$ to $PXA_{34}$ may form a first electrode layer in the display panel.

According to one or more embodiments of the present invention, the pixel definition layer PDL includes a partition wall PDL-W protruding from a surface thereof. The partition wall PDL-W may be formed of the same material as the pixel definition layer PDL. The partition wall PDL-W may overlap with the pixel definition layer PDL, and may be disposed in the non-light emitting area NPXA.

Referring to back FIG. 3, the partition wall PDL-W includes a first portion PDL-H extended in a row direction (or first direction) H and a second portion PDL-V extended in a column direction (or second direction) V. Each of the first and second portions PDL-H and PDL-V may be provided in a plural number. The first portions PDL-H may be integrally formed with the second portions PDL-W. In this case, each of the light emitting areas $PXA_{22}$ to $PXA_{34}$ is surrounded (e.g., the perimeter is surrounded) by the partition wall PDL-W when viewed in a plan view.

As shown in FIG. 4, the first common layer FL1 is located on the first electrode OE1 and the pixel definition layer PDL. Although not shown in the figures, the first common layer FL1, which may be integrally formed as a single unitary and individual unit, may be in the light emitting areas $PXA_{22}$ to $PXA_{34}$ and the non-light emitting area NPXA.

The first common layer FL1, at least a part of which is on the partition wall PDL-W, may have a step difference shape in the non-light emitting area NPXA. The first common layer FL1 may include a hole injection layer. The hole injection layer may contact the first electrode OE1. In addition, the first common layer FL1 may further include a hole transfer layer on the hole injection layer.

The organic light emitting pattern EMP may be on the first common layer FL1, and corresponds to the light emitting area $PXA_{23}$. Although not shown in the figures, the organic light emitting patterns EMP are respectively disposed in the light emitting areas $PXA_{22}$ to $PXA_{34}$ to form an organic light emitting layer in the display panel DP.

The second common layer FL2 may be on the organic light emitting pattern EMP and the first common layer FL1. Although not shown in the figures, the second common layer FL2 integrally formed as a single unitary and individual unit may be in the light emitting areas $PXA_{22}$ to $PXA_{34}$ and the non-light emitting area NPXA. The second common layer FL2 may include an electron injection layer. In addition, the second common layer FL2 may further include an electron transfer layer disposed between the organic light emitting pattern EMP and the electron injection layer. However, according to another exemplary embodiment, the second common layer FL2 may be omitted.

In FIG. 4, the second electrode OE2 is on the second common layer FL2, and corresponds to the light emitting area $PXA_{23}$. Although not shown in the figures, the second electrodes OE2 respectively disposed in the light emitting areas $PXA_{22}$ to $PXA_{34}$ may form a second electrode layer in the display panel DP. The second electrode OE2 may receive the second source voltage ELVSS.

In addition, a protective layer and/or a color filter layer may be disposed on the second electrode OE2. Another base substrate may be disposed on the second electrode OE2 to face the base substrate BS. The other base substrate may be a sealing substrate to protect the pixels $PX_{11}$ to PXnm.

Figure 5A:
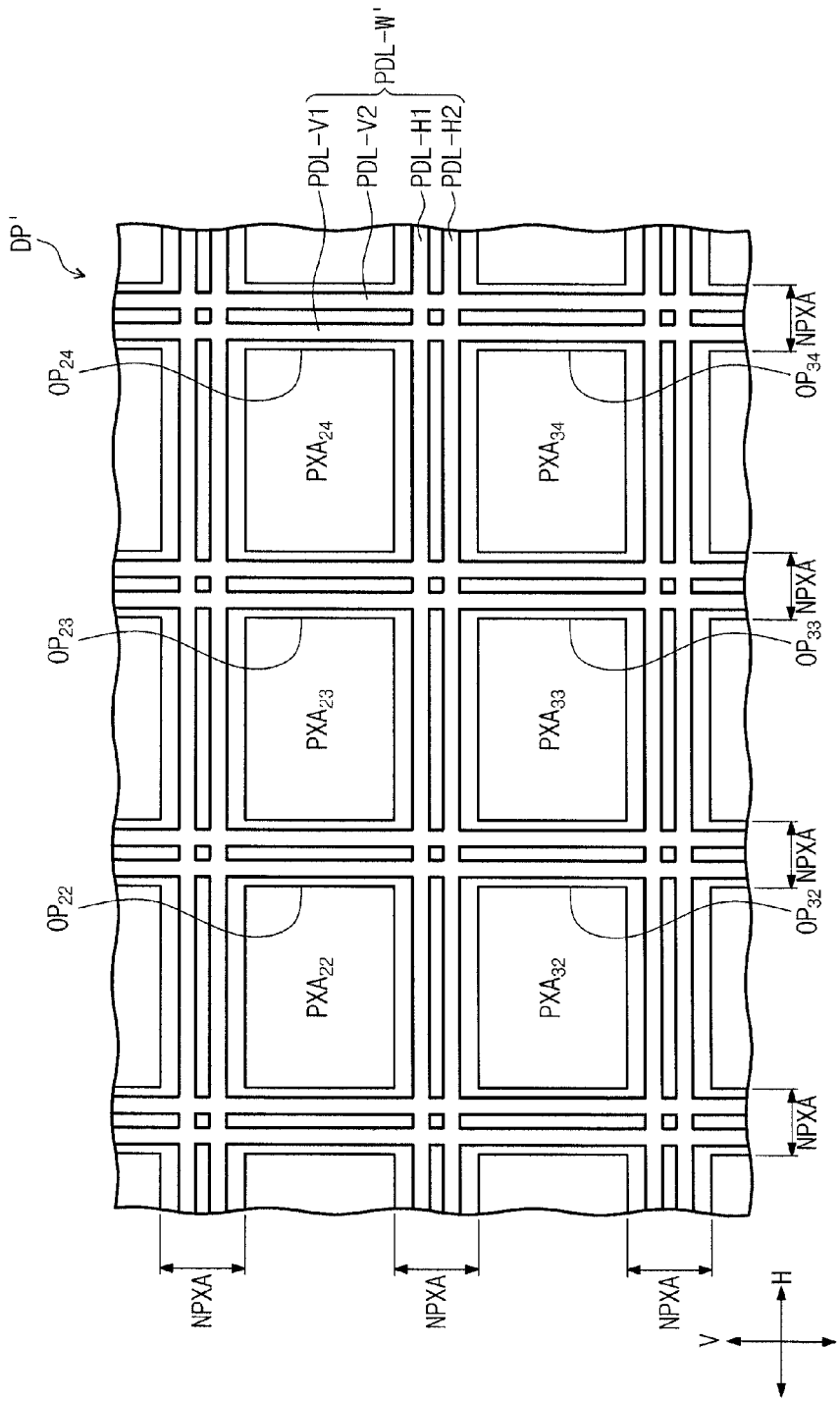
FIGS. 5A to 5C are schematic plan views illustrating display panels according to other exemplary embodiments of the present invention.
Figure 5B:
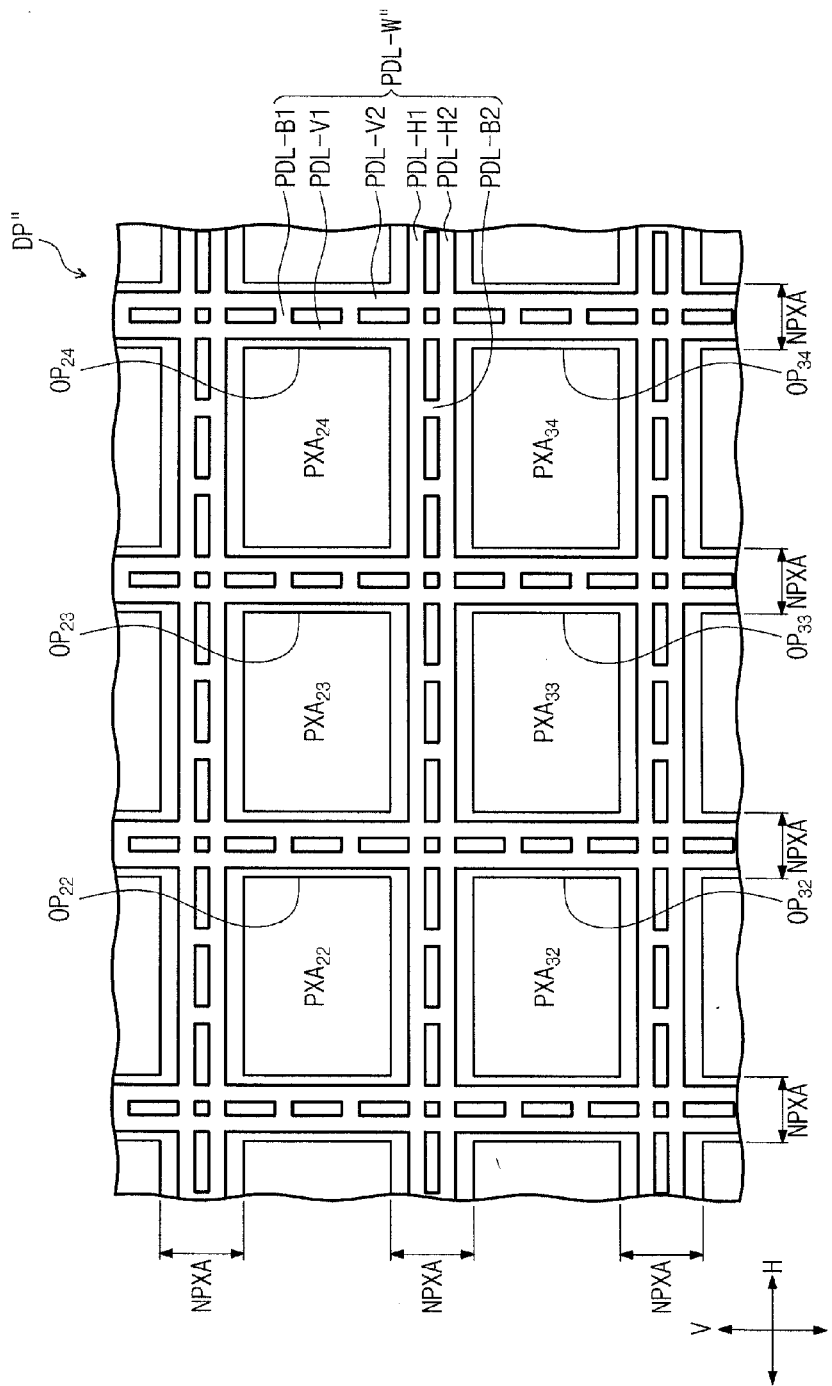
Figure 5C:
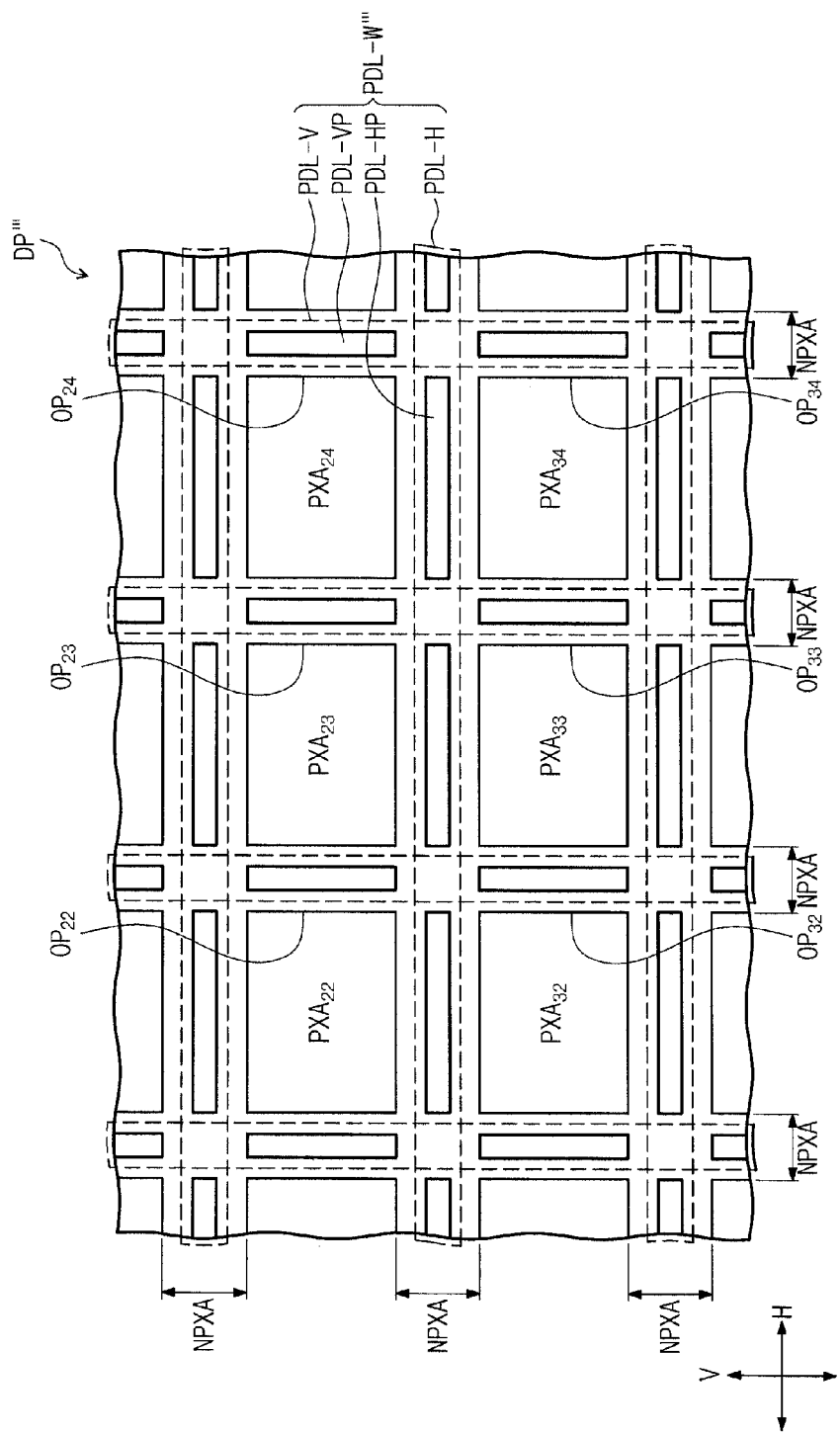

FIGS. 5A to 5C are schematic plan views illustrating display panels according to other exemplary embodiments of the present invention.

Referring to FIG. 5A, a display panel DP' includes a partition wall PDL-W', which includes a plurality of first portions PDL-H1 and PDL-H2 and a plurality of second portions PDL-V1 and PDL-V2.

When viewed in a plan view, the first portions PDL-H1 and PDL-H2 are arranged between two light emitting areas adjacent to each other in the column direction V among the light emitting areas $PXA_{22}$ to $PXA_{34}$. In addition, the second portions PDL-V1 and PDL-V2 are arranged between two light emitting areas adjacent to each other in the row direction H among the light emitting areas $PXA_{22}$ to $PXA_{34}$ when viewed in a plan view. The first portions PDL-H1 and PDL-H2 may be integrally formed with the second portions PDL-V1 and PDL-V2.

Referring to FIG. 5B, a display panel DP" includes a partition wall PDL-W", which includes the first portions PDL-H1 and PDL-H2 and the second portions PDL-V1 and PDL-V2. The partition wall PDL-W" further includes a first bridge portion PDL-B1 to connect the first portions PDL-H1 and PDL-H2 to each other. In addition, the partition wall PDL-W" further includes a second bridge portion PDL-B2 to connect the second portions PDL-V1 and PDL-V2 to each other.

Referring to FIG. 5C, a display panel DP'" includes a first portion PDL-H, which may include a plurality of first patterns PDL-HP spaced apart from each other, and includes the second portion PDL-V, which may include a plurality of second patterns PDL-VP spaced apart from each other. When viewed in a plan view, each of the light emitting areas $PXA_{22}$ to $PXA_{34}$ is surrounded by a portion of the first patterns PDL-HP and a portion of the second patterns PDL-VP.

FIGS. 6A to 6H are schematic cross-sectional views illustrating a method of manufacturing a display panel according to an exemplary embodiment of the present invention. FIGS. 6A to 6H show schematic cross sections corresponding to the light emitting area $PXA_{23}$ shown in FIG. 4.

Figure 6A:
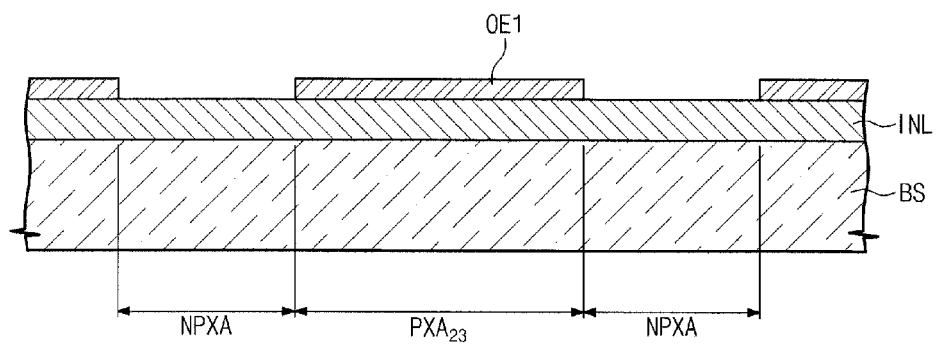
FIGS. 6A to 6H are schematic cross-sectional views illustrating a method of manufacturing a display panel according to an exemplary embodiment of the present invention.

Referring to FIG. 6A, the first electrode OE1 is formed on the base substrate BS. An area of the base substrate BS, in which the first electrode OE1 is formed, is referred to as the light emitting area $PXA_{23}$, and the area adjacent to the light emitting area $PXA_{23}$ is referred to as the non-light emitting area NPXA. The first electrode OE1 is disposed on the insulating layer INL, which is disposed on the base substrate BS.

The insulating layer INL may include the thin layers sequentially stacked one on another. In addition, a thin film transistor may be formed on the base substrate BS before the first electrode OE1 is formed. The thin film transistor may be formed by deposition, exposure, and development processes. Any one of the thin layers included in the insulating layer INL may serve as a portion of the thin film transistor.

Figure 6B:
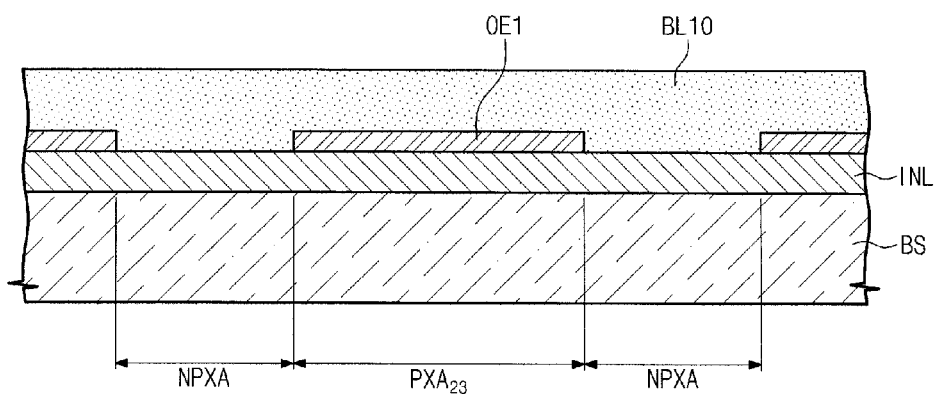

Referring to FIG. 6B, a base layer BL10 is formed on the insulating layer INL to cover the first electrode OE1. The base layer BL10 is patterned to define the pixel definition layer including the opening and the partition wall.

Figure 6C:
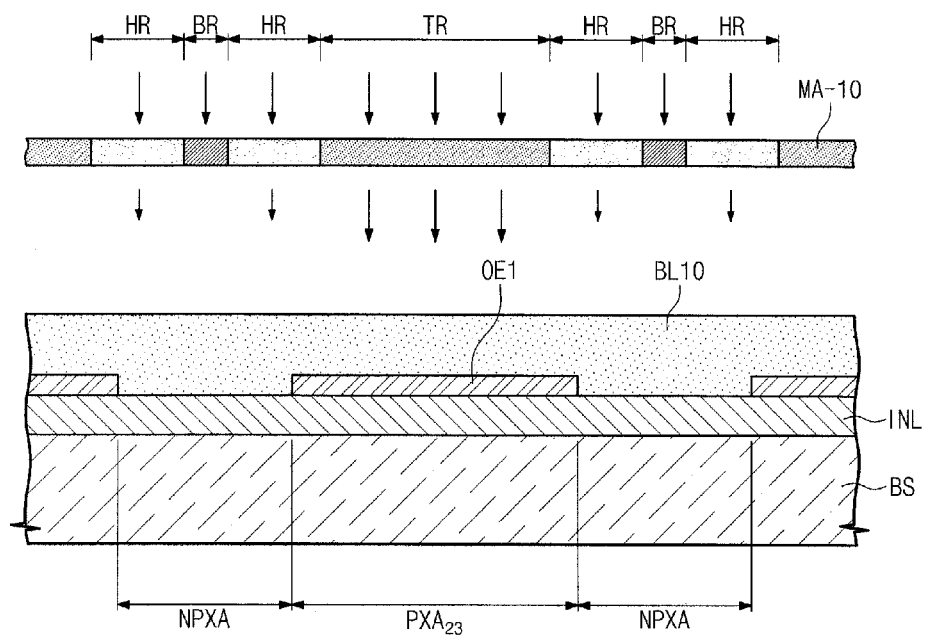

Referring to FIG. 6C, the base layer BL10 is patterned through an exposure and development process using a mask MA-10. The mask MA-10 may be a slit mask or a diffraction mask, and may include a transmission area TR, a block area BR, and a semi-transmission area HR adjacent to the transmission area TR and the block area BR. The transmission area TR transmits incident light to the base layer BL10, the block area BR blocks the incident light to the base layer BL10, and the semi-transmission area HR transmits a portion of the incident light to the base layer BL10. The arrow shown in FIG. 6C indicates the incident light.

The mask MA-10 may be disposed to allow the transmission area TR to correspond to the area in which the opening is formed, the block area BR to correspond to the area in which the partition wall is formed, and the semi-transmission area HR to correspond to an other area. The area in which the opening is formed corresponds to the light emitting area $PXA_{23}$, and the area in which the partition wall is formed and the other area correspond to the non-light emitting area NPXA.

Figure 6D:
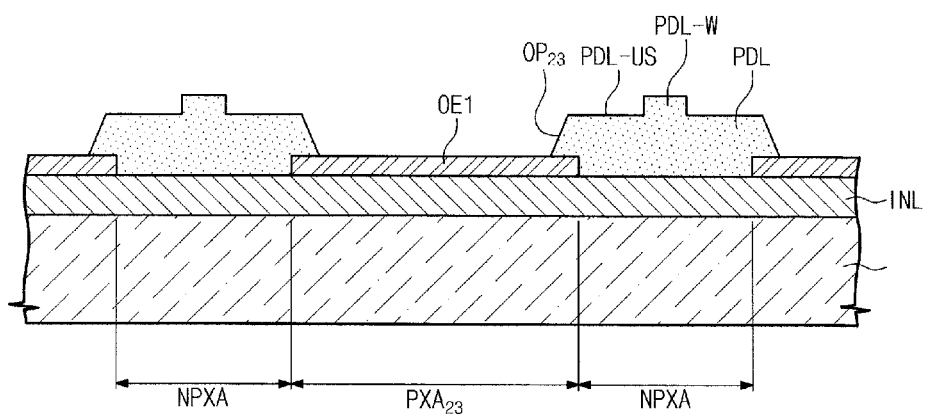

FIG. 6D shows the base layer BL10 after the exposure process is performed. Here, the pixel definition layer PDL including the opening $OP_{23}$ and the partition wall PDL-W is formed from the base layer BL10. The base layer BL10 has different thicknesses in different areas thereof. The opening $OP_{23}$ may be formed by completely removing the base layer BL10 in a thickness direction, the partition wall PDL-W may be formed by not removing the base layer BL10, and portions that form a surface PDL-US of the pixel definition layer PDL may be formed by partially removing the base layer BL10.

Figure 6E:
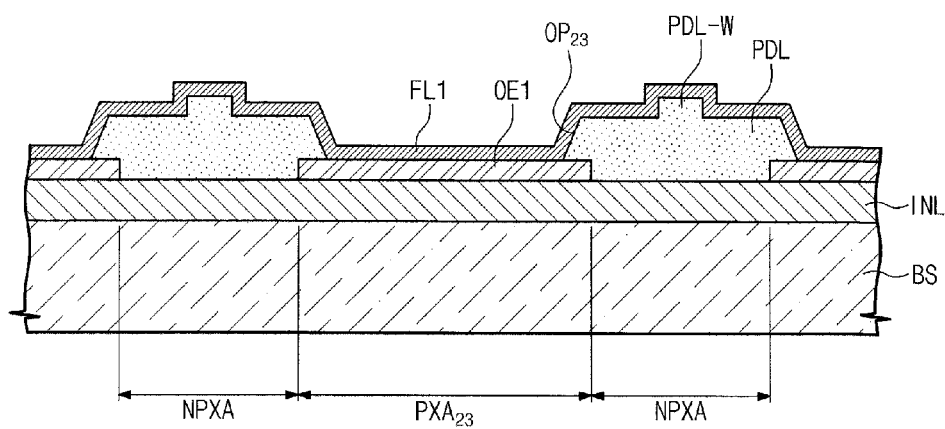

Referring to FIG. 6E, the first common layer FL1 is formed on the pixel definition layer PDL. The first common layer FL1 may include the hole injection layer. In addition, the first common layer FL1 may further include the hole transfer layer disposed on the hole injection layer.

Figure 6F:
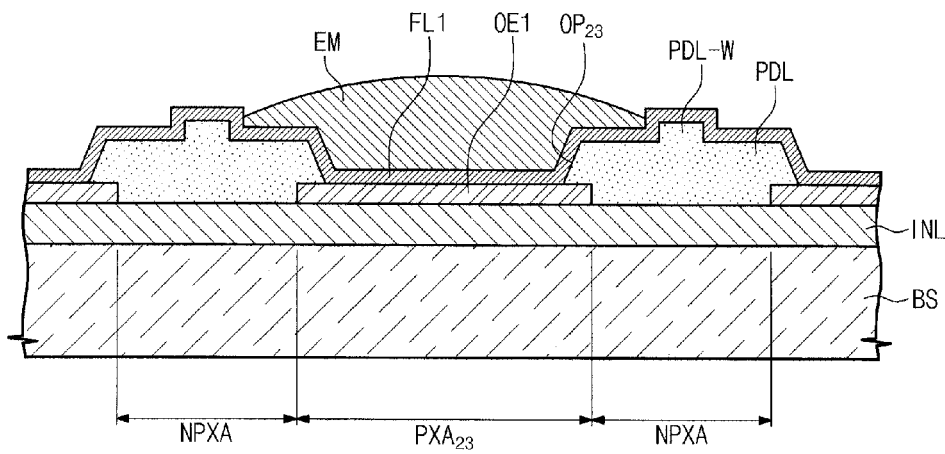

Referring to FIG. 6F, an organic light emitting material EM in a liquid state is disposed on the first common layer FL1. The organic light emitting material EM in the liquid state is disposed to correspond to the opening $OP_{23}$ of the pixel definition layer PDL. The organic light emitting material EM in the liquid state may be provided by, for example, an inkjet printing method or a nozzle printing method.

The partition wall PDL-W prevents (or inhibits) the organic light emitting material EM from flowing into adjacent light emitting areas $PXA_{22}$ and $PXA_{24}$ (refer to FIG. 3) from the light emitting area $PXA_{23}$ even if an amount of the organic light emitting material EM provided to the light emitting area $PXA_{23}$ is more (e.g., much more) than a reference amount. The reference amount is determined according to the area of the opening $OP_{23}$ and the area of the organic light emitting pattern EMP. The partition walls PDL-W shown in FIG. 5A to 5C have a similar function as the above-mentioned partition wall PDL-W. The adjacent light emitting areas $PXA_{22}$ and $PXA_{24}$ may be provided with organic light emitting materials that are different materials from the organic light emitting material provided to the light emitting area $PXA_{23}$. Accordingly, by preventing the organic light emitting material from flowing into adjacent light emitting areas, the different organic light emitting materials are prevented from mixing.

Figure 6G:
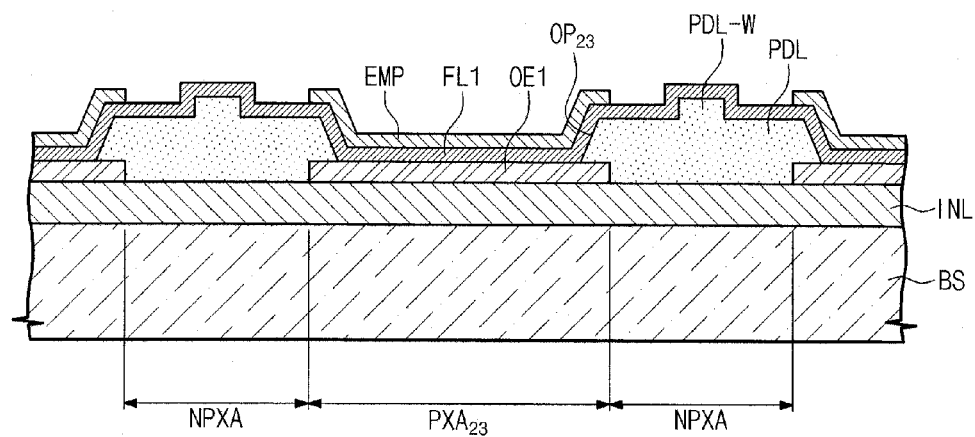

FIG. 6G shows the organic light emitting material EM after a solvent has been evaporated. The light emitting material EM (from which the solvent is evaporated) forms the organic light emitting pattern EMP.

Figure 6H:
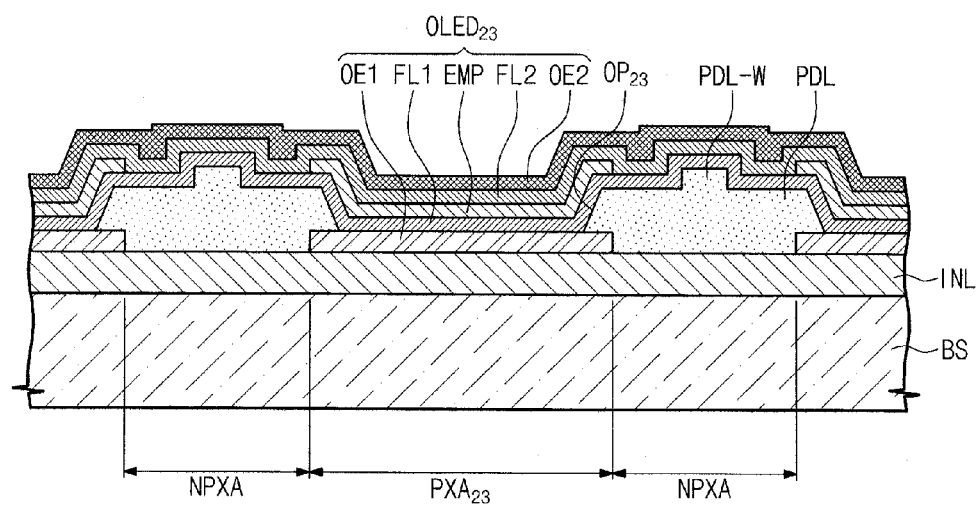

Then, the second common layer FL2 is formed on the first common layer FL1 to cover the organic light emitting pattern EMP, and the second electrode OE2 is formed on the second common layer FL2. When the processes are completed, the organic light emitting display panel is manufactured as shown in FIG. 6H. The second common layer FL2 may include at least one of the electron injection layer or the electron transfer layer. In addition, the second common layer FL2 may be omitted.

Figure 7:
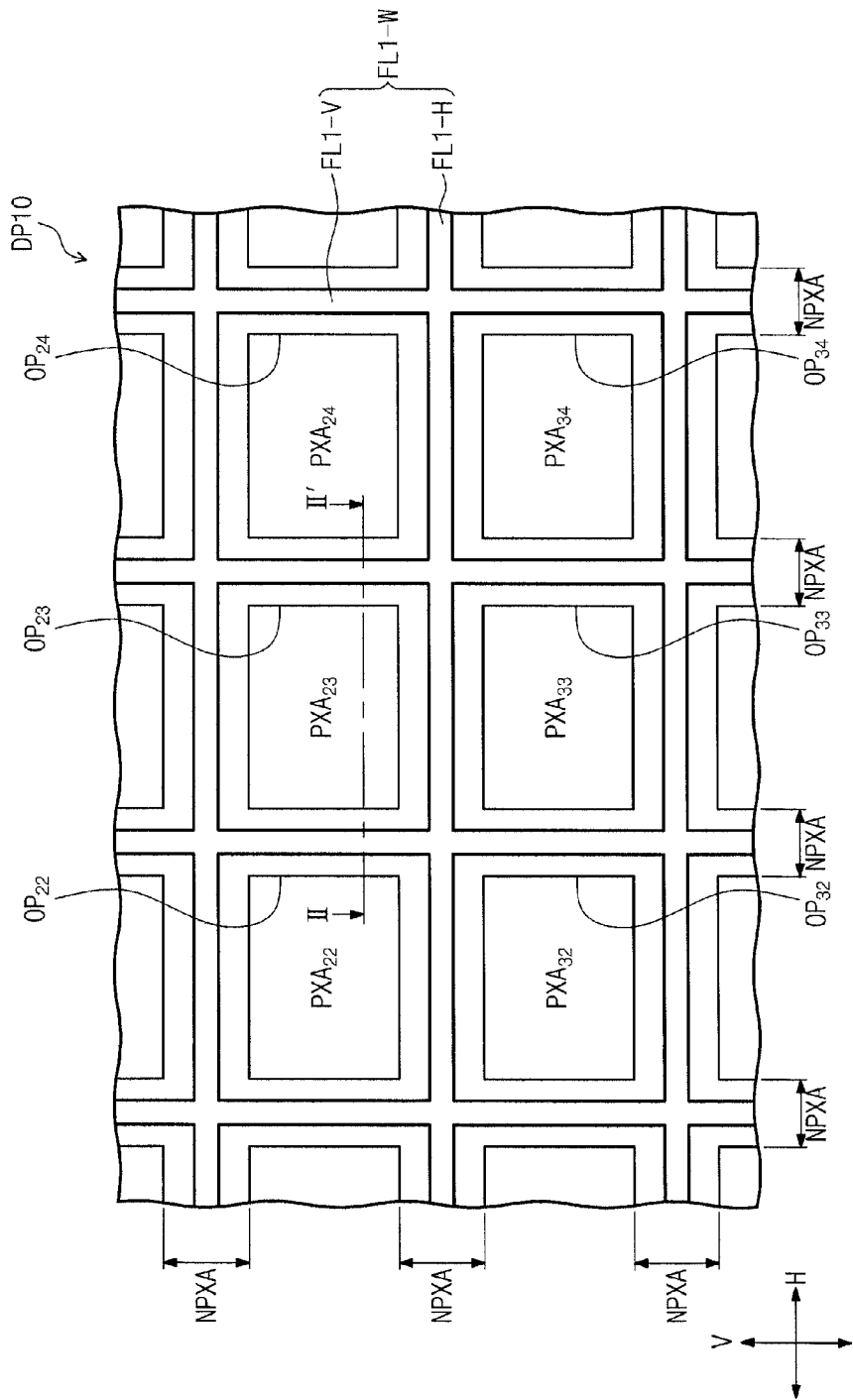
FIG. 7 is a schematic plan view illustrating a display panel according to another exemplary embodiment of the present invention.
Figure 8:
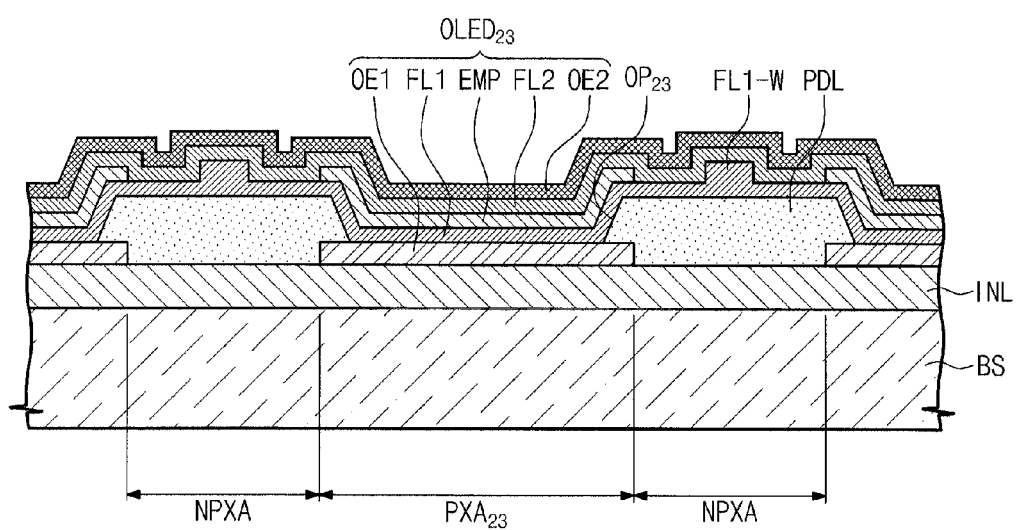
FIG. 8 is a schematic cross-sectional view taken along the line II-II' of FIG. 7.

FIG. 7 is a schematic plan view illustrating a display panel according to another exemplary embodiment of the present invention, and FIG. 8 is a schematic cross-sectional view taken along the line II-II' of FIG. 7. In FIGS. 7 and 8, the same (or similar) reference numerals denote the same elements in FIGS. 1 to 5C, and thus, detailed descriptions of the same elements will be given by way of reference to the above-descriptions.

Referring to FIG. 7, a display panel DP10 is divided into a plurality of light emitting areas $PXA_{22}$ to $PXA_{34}$ and a non-light emitting area NPXA adjacent to the light emitting areas $PXA_{22}$ to $PXA_{34}$. The light emitting areas $PXA_{22}$ to $PXA_{34}$ are surrounded by the non-light emitting area NPXA.

Referring to FIG. 8, an insulating layer INL is disposed on a surface of the base substrate BS. Although not shown in detail, the insulating layer INL may include a plurality of thin layers.

A pixel definition layer PDL including an opening $OP_{23}$ is disposed on the insulating layer INL. The opening $OP_{23}$ corresponds to the opening $OP_{23}$. The organic light emitting device $OLED_{23}$ may be disposed on the insulating layer INL.

The first electrode OE1 is disposed corresponding to the light emitting area $PXA_{23}$. The first electrode OE1 may receive the first source voltage ELVDD (refer to FIG. 1). The opening $OP_{23}$ may expose at least a portion of the first electrode OE1.

The first common layer FL1 may be disposed on the first electrode OE1 and the pixel definition layer PDL. The first common layer FL1 may include a hole injection layer. The first common layer FL1, which may be integrally formed as a single unitary and individual unit, may be disposed in the light emitting areas $PXA_{22}$ to $PXA_{34}$ and the non-light emitting area NPXA.

The first common layer FL1 may include a partition wall FL1-W protruding from a surface thereof. The partition wall FL1-W may be formed of the same material as the first common layer FL1. The partition wall FL1-W may overlap with the pixel definition layer PDL. That is, the partition wall FL1-W may be disposed in the non-light emitting area NPXA.

Referring to back FIG. 7, the partition wall FL1-W may include a first portion FL1-H extending in the row direction H, and a second portion FL1-V extending in the column direction V. According to other embodiments of the present invention, the partition wall FL1-W may have similar shapes to the pixel defining layer walls PDL-W shown in FIGS. 5A to 5C.

As shown in FIG. 8, the organic light emitting pattern EMP may be disposed on the first common layer FL1, and may correspond to the light emitting area $PXA_{23}$. The second common layer FL2 may be disposed on the organic light emitting pattern EMP and the first common layer FL1. However, according to another exemplary embodiment, the second common layer FL2 may be omitted.

The second electrode OE2 may be disposed on the second common layer FL2. The second electrode OE2 may receive the second source voltage ELVSS (refer to FIG. 1).

Figure 9:
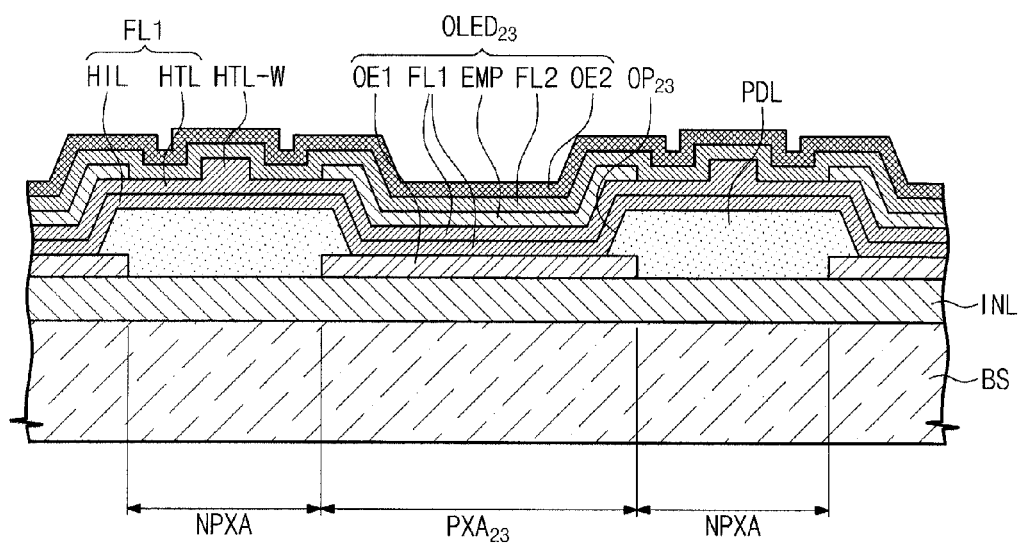
FIG. 9 is a schematic cross-sectional view illustrating a display panel according to another exemplary embodiment of the present invention.

FIG. 9 is a schematic cross-sectional view illustrating a display panel according to another exemplary embodiment of the present invention. In FIG. 9, the same (or similar) reference numerals denote the same elements in FIGS. 7 and 8, and thus detailed descriptions of the same elements will be given by way of reference to the above descriptions.

Referring to FIG. 9, the first common layer FL1 includes a hole injection layer HIL disposed on the first electrode OE1 and the pixel definition layer PDL, and a hole transfer layer HTL disposed on the hole injection layer HIL. The hole transfer layer HTL may include a partition wall HTL-W protruding from a surface thereof. The partition wall HTL-W may be formed of the same material as the hole transfer layer HTL. The second common layer FL2, which may be on the partition wall HTL-W, may have a step difference shape in the non-light emitting area NPXA.

FIGS. 10A to 10H are schematic cross-sectional views illustrating a method of manufacturing a display panel according to another exemplary embodiment of the present invention. In FIGS. 10A to 10H, the same (or similar) reference numerals denote the same elements in FIGS. 6A to 6H, and thus, detailed descriptions of the same elements will be given by way of reference to the above descriptions.

Figure 10A:
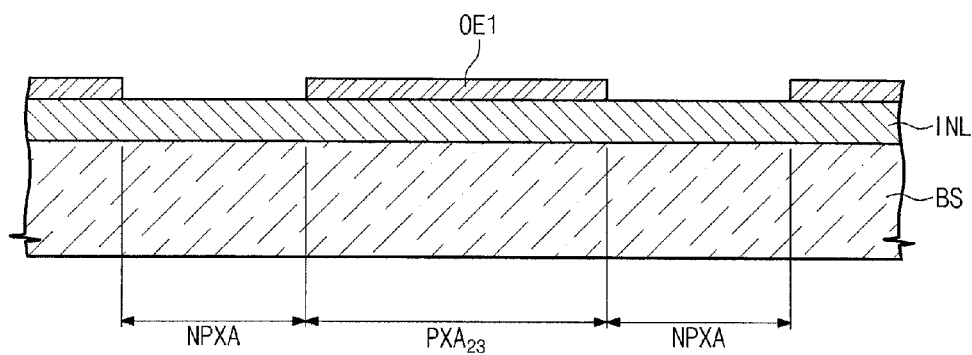
FIGS. 10A to 10H are schematic cross-sectional views illustrating a method of manufacturing a display panel according to another exemplary embodiment of the present invention.

Referring to FIG. 10A, a first electrode OE1 is formed on a base substrate BS. An area of the base substrate BS, in which the first electrode OE1 is formed, is referred to as the light emitting area $PXA_{23}$, and the area adjacent to the light emitting area $PXA_{23}$ is referred to as the non-light emitting area NPXA. The first electrode OE1 may be formed on the insulating layer INL disposed on the base substrate BS.

Figure 10B:
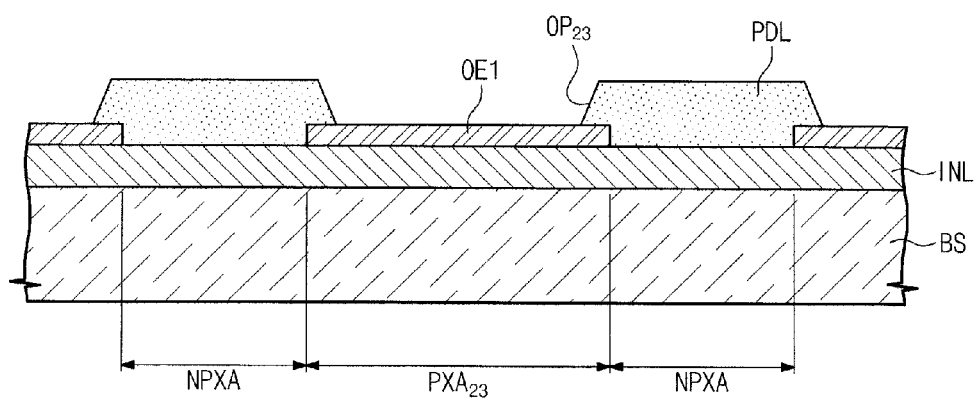

Referring to FIG. 10B, a pixel definition layer PDL including the opening $OP_{23}$ formed therethrough is disposed on the insulating layer INL. The pixel definition layer PDL may be formed from a base layer through an exposure and development process using a mask (not shown). The mask may be a slit mask or a diffraction mask, and may include a transmission area and a blocking area. The opening $OP_{23}$ may be formed in an area corresponding to the transmission area of the mask, and area other than the area for the opening $OP_{23}$ may be formed in an area corresponding to the block area of the mask.

Figure 10C:
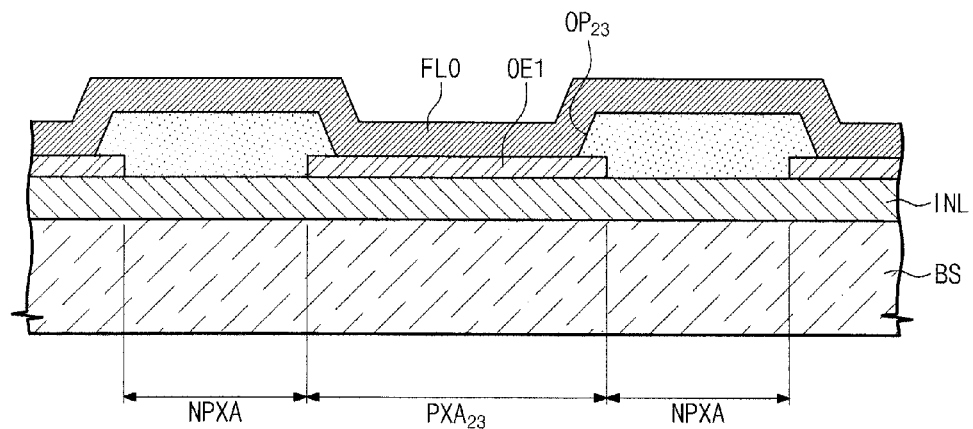

Referring to FIG. 10C, the base layer FL0 is formed on the insulating layer INL to cover the pixel definition layer PDL and the first electrode OE1. The base layer FL0 may be formed from a hole injection material, and may have a first thickness. The base layer FL0 may include a first layer formed from a hole injection material, and may include a second layer disposed on the first layer and formed from a hole transfer material.

Figure 10D:
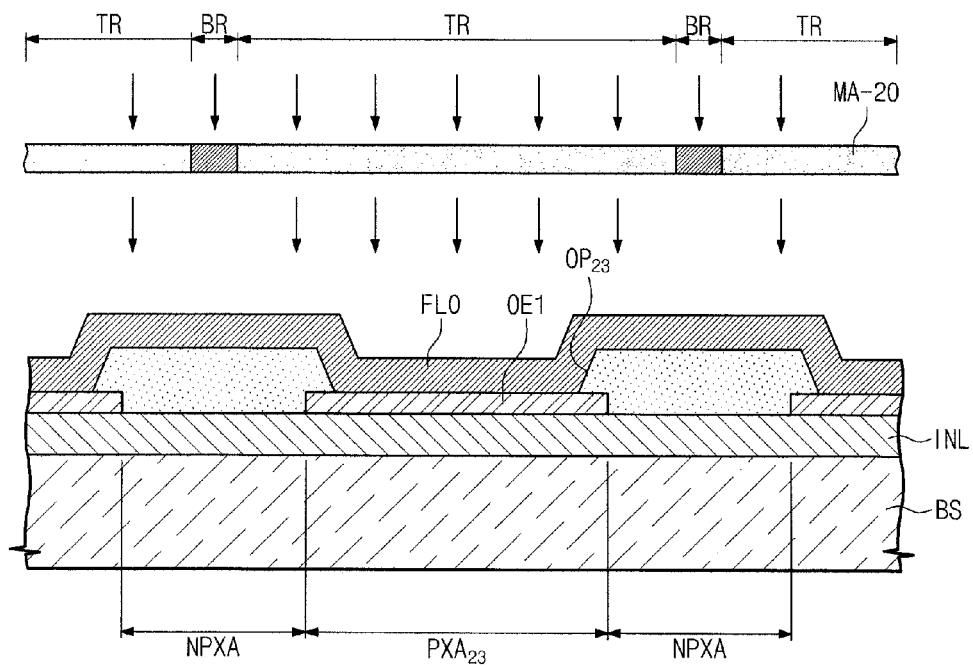

The base layer FL0 may be patterned through an exposure and development processes. As shown in FIG. 10D, the base layer FL0 is exposed to the light using a mask MA-20 including the transmission area TR and the block area BR. The block area BR may be located at a position corresponding to an area in which the partition wall is formed, and the transmission area TR may be located at a position corresponding to the other areas.

Figure 10E:
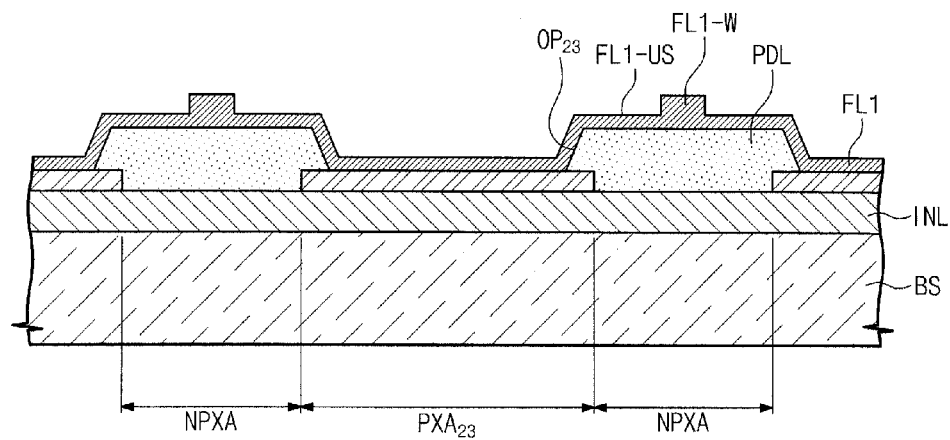

FIG. 10E shows the base layer FL0 after the exposure process. According to an embodiment of the present invention, the first common layer FL1 is formed from the base layer FL0 and has the partition wall FL1-W. Here, the base layer FL0 has a different thickness in areas corresponding to the partition wall FL1-W. That is, the partition wall FL1-W corresponds to an area from which the base layer FL0 is not removed and has the first thickness. Portions that form a surface FL1-US of the first common layer FL1, from which the base layer FL0 is partially removed, has a second thickness smaller than the first thickness.

Figure 10F:
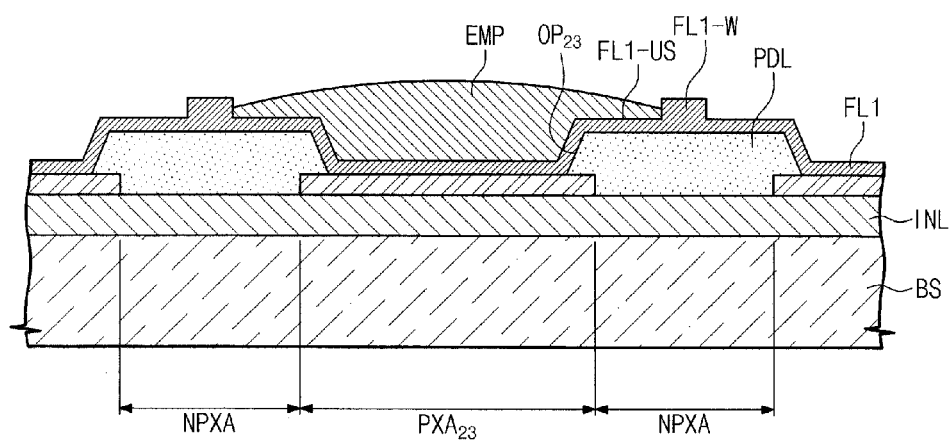

As shown in FIG. 10F, an organic light emitting material EM in a liquid state may be disposed onto the first common layer FL1. The organic light emitting material EM in the liquid state may be disposed to correspond to the opening $OP_{23}$ of the pixel definition layer PDL. The organic light emitting material EM in the liquid state may be provided by, for example, an inkjet printing method or a nozzle printing method.

The partition wall PDL-W prevents (or inhibits) the organic light emitting material EM from flowing into adjacent light emitting areas $PXA_{22}$ and $PXA_{24}$ (refer to FIG. 7) from the light emitting area $PXA_{23}$.

Figure 10G:
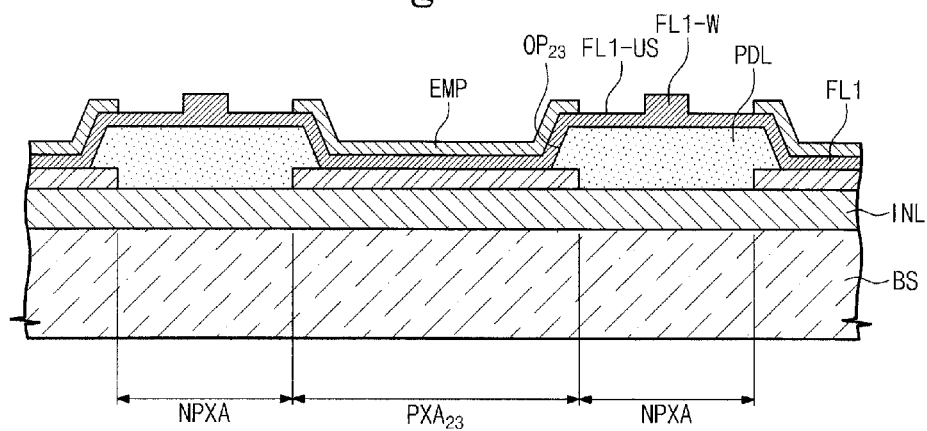

FIG. 10G shows the organic light emitting material EM from after a solvent has been evaporated. The light emitting material EM (from which the solvent is evaporated) forms the organic light emitting pattern EMP.

Figure 10H:
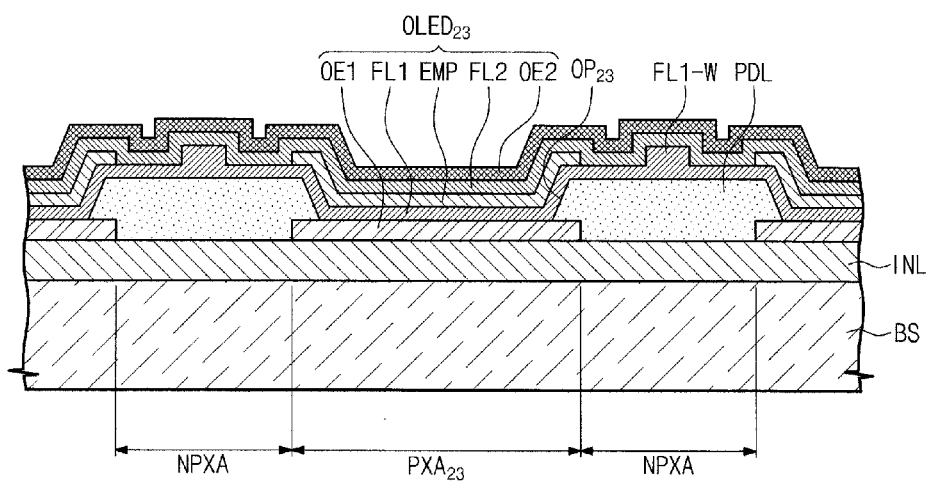

Then, the second common layer FL2 may be formed on the first common layer FL1 to cover the organic light emitting pattern EMP, and the second electrode OE2 may be formed on the second common layer FL2. When the above processes are completed, the organic light emitting display panel is manufactured as shown in FIG. 10H. The second common layer FL2 may include at least one of the electron injection layer or the electron transfer layer. In addition, the second common layer FL2 may be omitted.

Although various exemplary embodiments of the present invention have been described, it is understood that the present invention should not be limited to these exemplary embodiments but various changes and modifications can be made by one ordinary skilled in the art within the spirit and scope of the appended claims and their equivalents.

What is claimed is:
1. A method of manufacturing an organic light emitting display panel, the method comprising:
forming a first electrode layer comprising a plurality of first electrodes on a base substrate;

forming a pixel definition layer having a plurality of openings to respectively expose the first electrodes and a partition wall protruding from an upper surface of the pixel definition layer;

forming a first common layer covering the first electrodes and the pixel definition layer;

providing an organic light emitting material in a liquid state to areas corresponding to the openings to form an organic light emitting layer comprising a plurality of organic light emitting patterns; and forming a second electrode layer on the organic light emitting layer, wherein the partition wall comprises a plurality of partition wall portions extending along each other between adjacent light emitting areas, and the partition wall prevents the organic light emitting material provided to one opening of the openings from flowing into another opening of the openings adjacent to the one opening.

2. The method of claim 1, further comprising forming a second common layer between the organic light emitting layer and the second electrode layer to cover the organic light emitting layer.

3. The method of claim 1, wherein the forming of the pixel definition layer comprises:

forming a base layer on the base substrate to cover the first electrodes; and patterning the base layer using a mask comprising a transmission area corresponding to the openings, a block area corresponding to the partition wall, and a semi-transmission area adjacent to the transmission area and the block area.

4. The method of claim 1, wherein the organic light emitting material in the liquid state provided to portions of the areas corresponding to the openings is different from an organic light emitting material in the liquid state provided to other portions of the areas corresponding to the openings.

5. The method of claim 1, wherein the first common layer comprises at least one of a hole injection layer or a hole transfer layer.

6. The method of claim 1, wherein the first common layer comprises a hole injection layer and a hole transfer layer on the hole injection layer.

7. The method of claim 2, wherein the second common layer comprises at least one of an electron injection layer or an electron transfer layer.

8. The method of claim 1, wherein the partition wall comprises a bridge connecting the partition wall portions between the adjacent light emitting areas.

9. A method of manufacturing an organic light emitting display panel, the method comprising:

forming a first electrode layer comprising a plurality of first electrodes on a base substrate;

forming a pixel definition layer having a plurality of openings to respectively expose the first electrodes and a partition wall protruding from an upper surface of the pixel definition layer;

forming a first common layer covering the first electrodes and the pixel definition layer;

providing an organic light emitting material in a liquid state to areas corresponding to the openings to form an organic light emitting layer comprising a plurality of organic light emitting patterns; and forming a second electrode layer on the organic light emitting layer, wherein the partition wall comprises a plurality of partition wall portions surrounding each of a plurality of light emitting areas, and the partition wall prevents the organic light emitting material provided to one opening of the openings from flowing into another opening of the openings adjacent to the one opening.

* * * * *